United States Patent [19]

Ra et al.

[11] Patent Number: 5,874,200
[45] Date of Patent: Feb. 23, 1999

[54] METHOD FOR FORMING A PATTERN PREVENTING WATER MARK FORMATION

[75] Inventors: Hyung-Joo Ra, Incheon; Kyung-Hwa Jo, Seoul, both of Rep. of Korea

[73] Assignee: Daewoo Electronics Co., Ltd., Seoul, Rep. of Korea

[21] Appl. No.: 732,592

[22] Filed: Oct. 15, 1996

[51] Int. Cl.⁶ ........................................................ G03F 7/40
[52] U.S. Cl. ............................................ 430/313; 430/328
[58] Field of Search .................................... 430/311, 313, 430/323, 325, 328, 394, 396

[56] References Cited

U.S. PATENT DOCUMENTS 5,384,220   1/1995   Sezi .............................................. 430/8

*Primary Examiner*—Kathleen Duda
*Attorney, Agent, or Firm*—Beveridge, DeGrandi, Weilacher & Young, LLP

[57] ABSTRACT

A method for forming a pattern for preventing the formation of water marks on a semiconductor substrate during drying the semiconductor substrate after forming a resist pattern on the semiconductor substrate using a photoresist, is disclosed. An insulating layer is formed on the semiconductor substrate and the resist pattern is formed on the insulating layer. The resist pattern is exposed to ultraviolet rays to reduce the hydrophobicity of the surface portion of the resist pattern. Then, the exposed portion of the insulating layer by the resist pattern is wet etched by using the resist pattern as an etching mask. The sheet off time of deionized water from the surface of the resist pattern is lengthened. The semiconductor substrate becomes relatively hydrophobic when compared to the resist pattern. And the sheet off time of the remaining deionized water on the semiconductor substrate is shorter than that of the deionized water on the resist pattern. Accordingly, the deionized water on the surface of the semiconductor substrate can be advantageously removed.

17 Claims, 3 Drawing Sheets

METHOD FOR FORMING A PATTERN PREVENTING WATER MARK FORMATION

BACKGROUND OF THE INVENTION

1. Field of the Invention

The present invention relates to a method for forming a pattern, and more particularly to a method for forming a pattern for preventing the generation of water marks on a semiconductor substrate during drying of the semiconductor substrate after forming an insulating layer of a semiconductor device.

2. Prior Art

Generally, an insulating layer stacked on a semiconductor substrate is patterned into a predetermined shape by using a photolithography process for forming a mask, and using a wet etching process or a dry etching process.

FIGS. 1A & 1B illustrate a method for forming a pattern on a semiconductor substrate using a conventional wet etching process. Referring to FIG. 1A, an insulating layer 12 is firstly formed on a semiconductor substrate 10 by depositing an insulating material such as silicon oxide to have a predetermined thickness and then a photoresist layer 14 is formed on insulating layer 12 by coating a photoresist through a spin-coating method. Next, an opening 16 for exposing a portion of insulating layer 12 to be etched, is formed by pre-baking, exposing by using a mask having a predetermined pattern and then developing photoresist layer 14 by a common photo process. Photoresist pattern 14 is subject to hard-baking for increasing an etching resistance and an adhesiveness of photoresist pattern 14, and for removing remaining solvent.

Now, referring to FIG. 1B, insulating layer 12 is wet etched by using resist pattern 14 including opening 16 as an etching mask and using buffered oxide etchant (BOE: a mixture of $NH_4F:HF=6:1$ in volume ratio) as an etching solution which includes hydrogen fluoride. Then, a portion of insulating layer 12 exposed by opening 16 is removed to form an insulating pattern 12A. Next, semiconductor substrate 10 is rinsed in deionized water, and then dried in a dryer to remove the deionized water. Then, the remaining resist pattern 14 is removed by stripping.

Through the above-described method, after insulating layer 12 is patterned by using resist pattern 14 as an etching mask, semiconductor substrate 10 including the remaining resist pattern 14 is immersed into the deionized water, and then the deionized water is removed. At this time, a portion of the deionized water remains partially on semiconductor substrate 10. FIG. 2 illustrates deionized water 18 remaining on the exposed portion of semiconductor substrate 10 between insulating pattern 12A and an adjacent insulating pattern after the deionized water is removed.

The deionized water can be removed by a subsequent drying process. However, water marks are formed on the semiconductor substrate by the remaining deionized water. The water mark formed before forming a gate oxide layer becomes a contaminant. The water mark acts as an oxygen supplying source when the gate oxide layer is formed by a thermal oxidation process, to thereby form a locally thick oxide layer. This results in the electrical failure of the semiconductor device.

It is reported that the reason for the formation of the water mark depends on the wettability of silicon. (see: Effect of Drying Methods and Wettability of Silicon on the Formation of Water Marks in Semiconductor Processing by Jin-Goo Park and Michael F. Pas, J. Electrochem. Soc., Vol. 142, No. 6, pp2028–2031). According to Park et al., a hydrophilic wafer does not form the water marks by any kind of drying method such as a spin drying method, a vapor drying method, etc., while a hydrophobic wafer forms a lot of the water marks by the spin drying method. Further, a wafer having uniform hydrophilic surface or hydrophobic surface does not form the water marks during subsequent vapor drying. However, a wafer having a surface including both the hydrophilic portion and hydrophobic portion forms the water marks after isopropyl alcohol (IPA) vapor drying process after the patterning process. That is, a wafer having the hydrophilic surface, from which water can be removed uniformly during drying, does not form the water marks, while a wafer having a large difference in wettability of silicon forms a lot of the water marks. Accordingly, the difference in the wettability of the wafer surface plays an important role in formation of the water marks.

The wet etching process using hydrogen fluoride when forming the gate oxide layer is widely used. The surface of the semiconductor substrate or insulating layer exposed to the wet etching process using hydrogen fluoride has high hydrophobicity.

The resist pattern formed by the photoresist is made of organic materials and so is hydrophobic. The hydrophobicity of the resist pattern having such hydrophobicity is different from that of the surface of the semiconductor substrate or the insulating layer transformed to be hydrophobic. The water marks are thought to be formed because of these differences.

SUMMARY OF THE INVENTION

Accordingly, it is an object of the present invention considering the conventional problems as described above to provide a method for forming a pattern for preventing the formation of water marks on a semiconductor substrate when the semiconductor substrate is dried after forming a resist pattern having a predetermined shape using a photoresist on the semiconductor substrate.

To accomplish the above object, there is provided in the present invention a method for forming a pattern comprising the steps of:

forming a resist pattern on a semiconductor substrate;

exposing the resist pattern to ultraviolet rays for decreasing a hydrophobicity of a surface portion of the resist pattern; and wet etching the semiconductor substrate exposed by the resist pattern using the resist pattern as an etching mask.

The exposing of the resist pattern to the ultraviolet rays is carried out while heating the semiconductor substrate in a chamber. The heating of the semiconductor substrate is desirably carried out by heating the rear side of the semiconductor substrate primarily at from about 105° to about 120° C., preferably at about 120° C. for from about ten to about thirty five seconds, and then secondarily at from about 145° to about 170° C., preferably at about 170° C. for from about 40 to about 80 seconds by using a hot temperature plate. The exposure of the ultraviolet rays is carried out at a low power between about 20 $mW/cm^2$ and about 30 $mW/cm^2$, preferably about 25 $mW/cm^2$ for about five seconds and a high power between about 850 $mW/cm^2$ and about 870 $mW/cm^2$, preferably about 860 $mW/cm^2$ for about 60 to about 100 seconds, preferably about 80 seconds.

The object of the present invention also can be accomplished by a method for forming a pattern of a semiconductor device comprising the steps of:

forming an insulating layer on a semiconductor substrate;

forming a resist pattern on the insulating layer;

exposing the resist pattern to ultraviolet rays in order to make the surface portion of the resist pattern hydrophilic; and wet etching a portion of the insulating layer exposed by the resist pattern using the resist pattern as an etching mask.

At this time, the insulating layer is formed to have a thickness of about 250 Å or more by using silicon oxide. The insulating layer can be formed by oxidizing the surface portion of the semiconductor substrate or by depositing silicon oxide through a chemical vapor depositing method. The wet etching is carried out by using an etching solution containing hydrogen fluoride such as BOE. After wet etching, the semiconductor substrate is rinsed in deionized water and is naturally dried by the atmosphere.

Once the surface of the resist pattern is exposed to the ultraviolet rays, the hydrophobicity of the exposed surface portion of the resist pattern is decreased. The resist pattern is hydrophobic, however, through the exposure to the ultraviolet rays, the resist material at the surface portion reacts with oxygen locally remaining in the resist pattern to form oxygen bonds in the molecules, which reduces the resist pattern's hydrophobicity and increases the resist pattern's the hydrophilicity. Accordingly, the sheet off time of the deionized water from the surface of the resist pattern is lengthened. Since the hydrophobicity of the semiconductor substrate is relatively higher than that of the resist pattern, the sheet off time of the remaining deionized water on the semiconductor substrate becomes relatively shorter. Ultimately, the deionized water on the surface of the semiconductor substrate can be advantageously removed.

BRIEF DESCRIPTION OF THE DRAWINGS

The above object and advantages of the present invention will become more apparent by describing in detail a preferred embodiment thereof with reference to the attached drawings in which.

DETAILED DESCRIPTION OF THE INVENTION

Hereinafter, the preferred embodiment of the present invention will be explained in more detail with reference to the accompanying drawings.

Figure 3A:
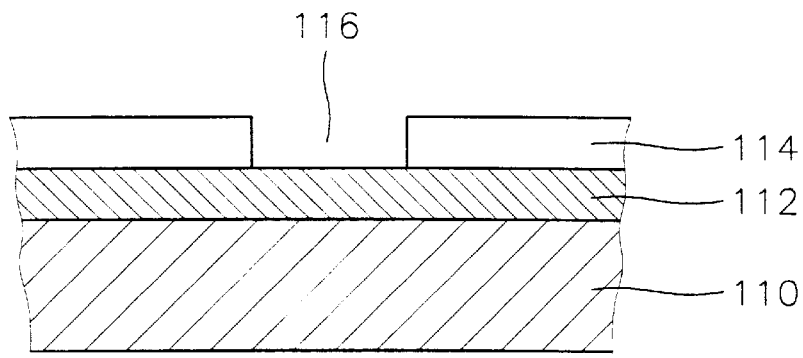
FIGS. 3A to 3C are cross-sectional views for showing the method of forming a pattern according to an embodiment of the present invention.
Figure 3B:
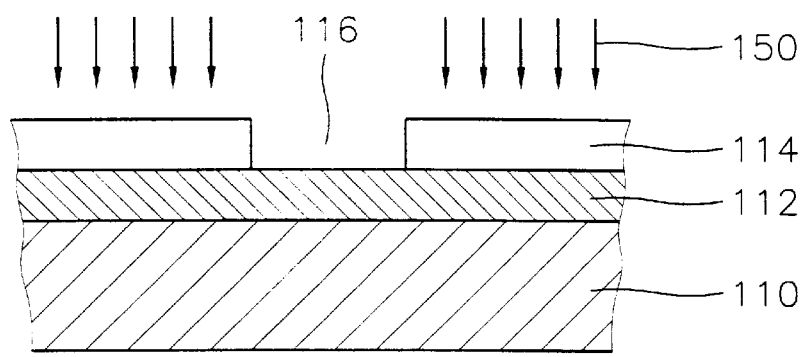
Figure 3C:
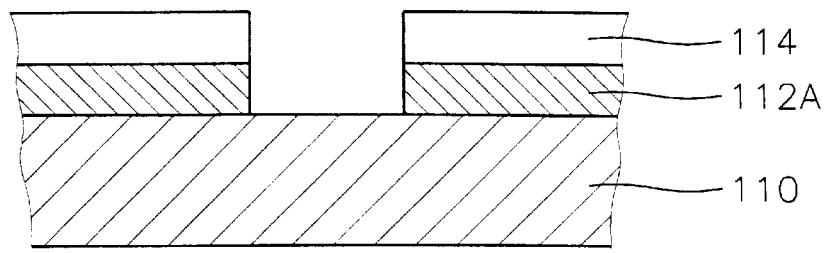

FIGS. 3A to 3C are cross-sectional views for showing the method for forming a pattern according to a preferred embodiment of the present invention. Referring to FIG. 3A, an insulating layer 112 having a predetermined thickness (for example, about 250 Å or more) is formed by using a thermal oxidation method to oxidize the surface portion of a semiconductor substrate 110. The resulting insulating layer 112 is comprised of silicon oxide. A resist layer 114 is formed by using a spin coating method to coat a photoresist on insulating layer 112. Next, photoresist layer 114 is subject to pre-baking, is exposed through a mask having a predetermined pattern, and then is developed by a common photolithography method to form an opening 116 which exposes a portion of insulating layer 112 to be etched.

Referring to FIG. 3B, resist pattern 114 is exposed to ultraviolet rays 150 to reduce the hydrophobicity of the surface portion of resist pattern 114. That is, the resist pattern comes to have more hydrophilicity than an original hydrophilicity thereof. Etching resistance and adhesive strength of resist pattern 114 are increased and remaining solvent is removed by an ultraviolet treatment as in a conventional hard baking process. Further, the surface portion of resist pattern 114 made from high molecular material is partially activated by the action of ultraviolet rays 150, to combine with remaining oxygen molecules in the remaining solvent. It is thought that this reduces the hydrophobicity of resist pattern 114, while increasing the hydrophilicity thereof.

Meanwhile, an equipment for exposing the ultraviolet rays on the surface of resist pattern 114 includes an atmospheric chamber. In the chamber, a supporter for supporting semiconductor substrate 110 having resist pattern 114 is provided and an ultraviolet exposing lamp is provided above the supporter at a predetermined distance from the supporter. A heater for heating the semiconductor substrate is provided under the supporter.

That is, semiconductor substrate 110 supported by the supporter is heated by the operation of the heater and resist pattern 114 formed on semiconductor substrate 110 is exposed to the ultraviolet rays by the ultraviolet exposing lamp.

The ultraviolet exposure is carried out primarily at from about 105° to about 120° C. for from about ten to about thirty five seconds and then secondarily at an increased temperature of from about 145° to about 170° C. for from about 40 to about 80 seconds by using a hot temperature plate. At this time, the resist pattern is exposed to the ultraviolet rays having a wavelength range of about 220 to about 320 nm (or at a low power between about 20 mW/cm$^2$ and about 30 mW/cm$^2$, preferably about 25 mW/cm$^2$ for about three to seven seconds, preferably five seconds, and at a high power between about 850 mW/cm$^2$ and about 870 mW/cm$^2$, preferably about 860 mW/cm$^2$ for sixty to one hundred seconds, preferably about 80 seconds).

Referring to FIG. 3C, insulating layer 112 is wet etched by using resist pattern 114 having opening 116 and the surface thereof which becomes hydrophilic as an etching mask, and using BOE (buffered oxide etchant: a mixture of NH$_4$F:HF= 6:1 in volume ratio) containing hydrogen fluoride as an etchant, to remove a portion of exposed insulating layer 112 by opening 116 to form an insulating layer pattern 112A. Next, semiconductor substrate 110 is rinsed in deionized water. Then, the remaining deionized water is removed from semiconductor substrate 110 by a drying process in a drier.

At this time, the hydrophobicity of resist pattern 114 is reduced and insulating layer pattern 112A exposed by the wet etching process, and the exposed surface portion of semiconductor substrate 110 becomes hydrophobic. That is, the hydrophobicity of resist pattern 114 is smaller than that of the exposed surface portion of semiconductor substrate 110. Accordingly, the deionized water remaining in a space between insulating layer patterns 112A moves toward resist pattern 114 and is dried during the moving by the attraction of hydrophilic resist pattern 114. That is, the deionized water in the space between insulating layer patterns 112A which is more hydrophobic, is firstly removed and then the deionized water on resist pattern 114 which is less hydrophobic, is subsequently removed. Accordingly, among the deionized water used during the rinsing process, the deionized water on semiconductor substrate 110 is firstly removed during the drying process and the deionized water on resist pattern 114 is subsequently removed, in order to completely remove the deionized water on semiconductor substrate 110, to prevent the formation of water marks. That is, since semiconductor substrate 110 exposed during the formation of insulating layer pattern 112A is strongly hydrophobic while resist pattern 114 is weakly hydrophobic, the deionized water remaining on the surface of semiconductor substrate 110 during the removing process of the deionized water is completely removed while a portion of the deionized water on the surface of resist pattern 114 remains. The remaining deionized water on resist pattern 114 can be removed by drying in the drier. Ultimately, the formation of the water marks on semiconductor substrate 110 can be prevented. Insulating layer pattern 112A having a predetermined shape is completed by stripping remaining resist pattern 114.

Figure 1A:
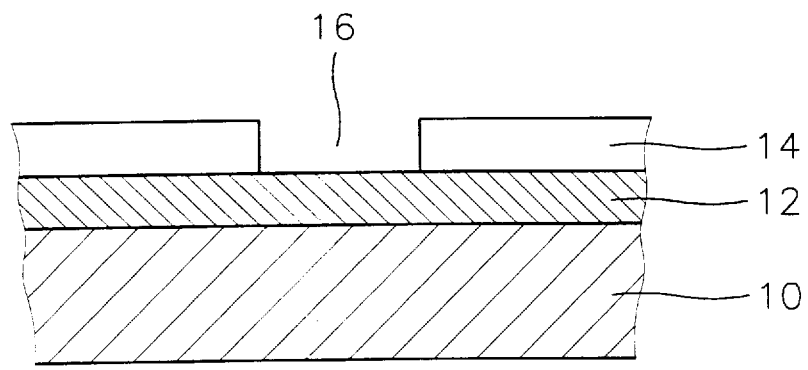
FIGS. 1A & 1B are cross-sectional views for showing the method of forming a pattern on a semiconductor substrate by using the conventional wet etching process.
Figure 1B:
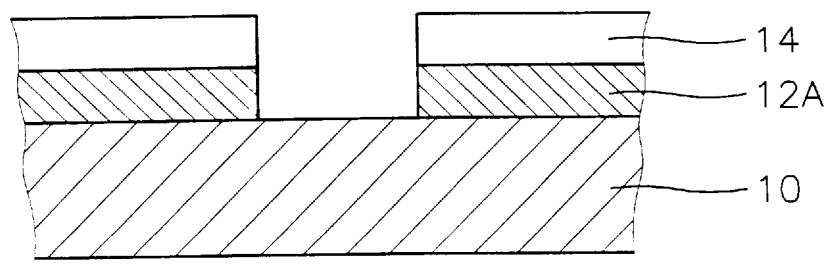
Figure 2:
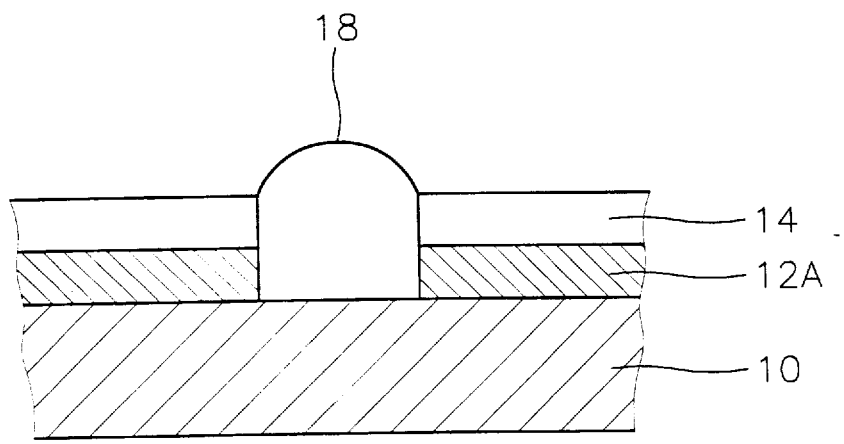
FIG. 2 illustrates deionized water remaining on the exposed semiconductor substrate between insulating layer patterns when the deionized water is removed during carrying out the method illustrated in FIGS. 1A & 1B.

Resist patterns are formed by the method of the present invention as illustrated in FIGS. 3A to 3C, and by the conventional method as illustrated in FIGS. 1A and 1B.

First, an oxide layer having a thickness of about 250 Å was formed by thermal oxidizing the surface portion of a semiconductor substrate. As a result, a resist pattern was formed. The resist pattern was treated by ultraviolet rays according to the method of the present invention. The ultraviolet treatment was carried out primarily at about 120° C. for thirty five seconds, and secondarily at about 170° C. for about forty seconds by using a hot temperature plate which supports the semiconductor substrate, at a low power of about 25 mW/cm$^2$ for about five seconds and at a high power of 860 mW/cm$^2$ for eighty seconds. Next, the oxide layer was wet etched by using the resist pattern as an etching mask and using BOE as an etchant, and the semiconductor substrate was rinsed in deionized water to form an oxide layer pattern.

Meanwhile, an oxide layer pattern was formed by the same method as described above, except using the conventional hard baking process instead of the ultraviolet treatment. At this time, the hard baking was carried out at about 130° C. for thirty minutes in an oven.

After forming the resist pattern, the resist pattern was rinsed in the deionized water. At this time, the sheet off time of the remaining deionized water on the resist pattern was observed.

In addition, oxide layer patterns were formed by etching through a wet etching method using the resist patterns formed by the method of the present invention and the conventional method, rinsed in the deionized water, and naturally dried by the atmosphere. Then, the occurrence of water marks was observed with a microscope. Twenty points on a wafer selected through random sampling were observed.

The observed sheet off time and water mark occurrence are illustrated in Table 1.

TABLE 1

| | sheet off time (sec.) | water mark occurrence (%) |
|---|---|---|
| the method of the present invention | 190.0 | 0.0 |
| the conventional method | 0.8 | 80.0 |

As shown in Table 1, the sheet off time of the deionized water on the resist pattern treated with the ultraviolet rays according to the method of the present invention is about 190.0 seconds, while the sheet off time of the deionized water on the resist pattern formed by the conventional hard baking process is about 0.8 second.

That is, it can be known that the surface portion of the resist pattern exposed to the ultraviolet rays is transformed to become hydrophilic, and the sheet off time is lengthened about 200 times or more.

In addition, the water marks were not observed in the wafer formed by the method of the present invention, while sixteen water marks were observed in the wafer formed by the conventional method. That is, in case of not exposing the surface of the resist pattern to the ultraviolet rays as in the conventional method, water mark occurrence was 80.0%, while in case of exposing the surface of the resist pattern to the ultraviolet rays as in the method of the present invention, water mark occurrence was 0.0%. Accordingly, it can be noted that the formation of the water marks can be effectively prevented by the method of the present invention.

When the surface of the resist pattern is exposed to the ultraviolet rays according to the method of the present invention, the surface portion of the resist pattern becomes hydrophilic, and the sheet off time of the deionized water on the resist pattern is lengthened. In addition, the semiconductor substrate becomes relatively hydrophobic when compared to the resist pattern. Therefore, the sheet off time of the deionized water remaining on the semiconductor substrate is shorter than that of the deionized water on the resist pattern. Ultimately, the deionized water on the surface of the semiconductor substrate can be advantageously removed.

By making the sheet off time of the deionized water remaining on the semiconductor substrate shorter than that of the deionized water on the resist pattern before drying the semiconductor substrate, the deionized water on the surface of the semiconductor substrate can be advantageously removed and the formation of the water marks can be prevented.

The present invention can be applied to a process in which the surface of a semiconductor wafer is exposed during the wet etching of the oxide layer by using the BOE solution after the formation of the resist pattern during the formation of the semiconductor, such as the wet etching process of the oxide layer or the wet etching process of a buried contact, to prevent the formation of the water marks. Thus, the reliance on the wet etching process of the insulating layer can be increased.

Although the preferred embodiment of the invention has been described, it is understood that the present invention should not be limited to this preferred embodiment, but various changes and modifications can be made by one skilled in the art within the spirit and scope of the invention as hereinafter claimed.

What is claimed is:

1. A method for forming a pattern comprising the steps of:

forming a resist pattern on a semiconductor substrate to expose a portion of said semiconductor substrate;

exposing said resist pattern to ultraviolet rays for decreasing hydrophobicity of a surface portion of said resist pattern so that the surface portion of said resist pattern has a hydrophobicity which is smaller than a hydrophobicity of said exposed portion of said semiconductor substrate; and wet etching said exposed portion of said semiconductor substrate by using said resist pattern as an etching mask, whereby water mark occurrences on said semiconductor substrate during drying said semiconductor substrate are prevented.

2. A method for forming a pattern as claimed in claim 1, wherein said exposing of said resist pattern to said ultraviolet rays is carried out under an atmosphere while heating said semiconductor substrate.

3. A method for forming a pattern as claimed in claim 2, wherein said heating of said semiconductor substrate is carried out by heating a rear side of said semiconductor substrate primarily at a temperature between about 105° and about 120° C. for about ten to thirty five seconds and then secondarily at a temperature between about 145° and 170° C. for about forty to about eighty seconds by using a hot temperature plate.

4. A method for forming a pattern as claimed in claim 1, wherein said exposing of said ultraviolet rays is carried out at a low power between about 20 mW/cm$^2$ and about 30 mW/cm$^2$ for about five seconds and at a high power between about 850 mW/cm$^2$ and about 870 mW/cm$^2$ for about 80 seconds.

5. A method for forming a pattern comprising the steps of:

forming an insulating layer on a semiconductor substrate;

forming a resist pattern on said insulating layer to expose a portion of said insulating layer;

exposing said resist pattern to ultraviolet rays for decreasing hydrophobicity of a surface portion of said resist pattern so that the surface portion of said resist pattern has a hydrophobicity which is smaller than a hydrophobicity of said semiconductor substrate after a subsequent wet etching process; and wet etching said exposed portion of said insulating layer using said resist pattern as an etching masks whereby water mark occurrences on said semiconductor substrate during drying said semiconductor substrate are prevented.

6. A method for forming a pattern of a semiconductor device claimed in claim 5, wherein said insulating layer is formed to have a thickness of about 250 Å or more by using silicon oxide.

7. A method for forming a pattern of a semiconductor device as claimed in claim 6, wherein said insulating layer is formed by oxidizing a surface portion of said semiconductor substrate.

8. A method for forming a pattern of a semiconductor device as claimed in claim 6, wherein said insulating layer is formed by depositing said silicon oxide through a chemical vapor deposition method.

9. A method for forming a pattern of a semiconductor device as claimed in claim 5, wherein said wet etching is carried out by using an etching solution containing hydrogen fluoride.

10. A method for forming a pattern of a semiconductor device as claimed in claim 5, further comprising the steps of:

rinsing said semiconductor substrate in deionized water after said wet etching; and drying said semiconductor substrate in an atmosphere.

11. A method for forming a pattern of a semiconductor device as claimed in claim 5, wherein said exposing of said resist pattern to said ultraviolet rays is carried out under vacuum while heating said semiconductor substrate.

12. A method for forming a pattern of a semiconductor device as claimed in claim 11, wherein said heating of said semiconductor substrate is carried out by heating a rear side of said semiconductor substrate primarily at a temperature between about 105° and about 120° C. for about ten to thirty five seconds and then secondarily at a temperature between about 145° and 170° C. for about forty to about eighty seconds using a hot temperature plate.

13. A method for forming a pattern of a semiconductor device as claimed in claim 11, wherein said exposing of said ultraviolet rays is carried out at a low power between about 20 mW/cm$^2$ and about 30 mW/cm$^2$ for about five seconds and at a high power between about 850 mW/cm$^2$ and about 870 mW/cm$^2$ for about 80 seconds.

14. A method for forming a pattern of a semiconductor device comprising the steps of:

forming an insulting layer composed of silicon oxide having a thickness of 250 Å or more, on a semiconductor substrate;

forming a resist pattern on said insulating layer to expose a portion of said insulating layer;

exposing said resist pattern to ultraviolet rays while heating said semiconductor substrate primarily at a temperature between about 105° C. and about 120° C. for about ten to thirty-five seconds and then secondarily at a temperature between about 145° C. and about 170° C. for about forty to about eighty seconds using a hot temperature plate for decreasing hydrophobicity of a surface portion of said resist pattern so that the surface portion of said resist pattern has a hydrophobicity which is smaller than a hydrophobicity of said semiconductor substrate;

wet etching said exposed portion of said insulating layer using said resist pattern as an etching mask and using etching solution containing hydrogen fluoride;

rinsing said semiconductor substrate in deionized water; and drying said semiconductor substrate in an atmosphere.

whereby water mark occurrences on said semiconductor substrate during said drying said semiconductor substrate are prevented.

15. A method for forming a pattern of a semiconductor device as claimed in claim 14, wherein said insulating layer is formed by oxidizing a surface portion of said semiconductor substrate.

16. A method for forming a pattern of a semiconductor device as claimed in claim 14, wherein said insulating layer is formed by depositing said silicon oxide through a chemical vapor deposition method.

17. A method for forming a pattern of a semiconductor device as claimed in claim 14, wherein said exposing of said ultraviolet rays is carried out at a low power between about 20 mW/cm$^2$ and about 30 mW/cm$^2$ for about five seconds and at a high power between about 850 mW/cm$^2$ and about 870 mW/cm$^2$ for about 80 seconds.

* * * * *